United States Patent [19]

Reuting

[11] 4,137,559

[45] Jan. 30, 1979

[54] SOCKET ASSEMBLY

[75] Inventor: Hans-Werner Reuting, Peine, Fed. Rep. of Germany

[73] Assignee: Elmeg-Elektro-Mechanik Gesellschaft mit beschrankter Haftung, Peine, Fed. Rep. of Germany

[21] Appl. No.: 812,312

[22] Filed: Jul. 1, 1977

[30] Foreign Application Priority Data

Jun. 30, 1976 [DE] Fed. Rep. of Germany ....... 2629358

[51] Int. Cl.² .............................................. H02B 1/04
[52] U.S. Cl. .................................. 361/331; 361/393; 200/307; 335/132
[58] Field of Search ............... 361/331, 393, 394, 380, 361/417, 419, 420; 335/132; 200/307; 339/17 C, 17 CF

[56] References Cited

U.S. PATENT DOCUMENTS

| 2,878,336 | 3/1959 | Ehrlich | 200/303 |
|---|---|---|---|
| 3,159,365 | 12/1964 | Watson | 200/307 |
| 3,188,404 | 6/1965 | Fichter | 200/307 |
| 3,200,208 | 8/1965 | Mastney | 200/307 |
| 3,211,854 | 10/1965 | Bengtsson | 335/202 |
| 3,286,070 | 11/1966 | Volker | 200/303 |
| 3,340,439 | 9/1967 | Henschen | 361/394 |
| 3,559,802 | 2/1971 | Eidus | 29/413 |
| 3,559,855 | 2/1971 | Barnett | 29/413 |
| 3,643,135 | 2/1972 | Devore | 361/394 |
| 3,655,925 | 4/1972 | Lincoln | 200/307 |
| 3,715,629 | 2/1973 | Swengel, Sr. | 361/394 |
| 3,808,506 | 4/1974 | Lang | 361/394 |
| 3,921,107 | 11/1975 | Reuting | 335/136 |

*Primary Examiner*—Gerald P. Tolin
*Attorney, Agent, or Firm*—Smyth, Pavitt, Siegemund, Jones & Martella

[57] ABSTRACT

Plural quadrilateral frames are stacked in a tube with quadrilateral cross section. Contact springs are arranged in several levels and continued through the socket wall for termination in externally accessible contact pins. The contact springs hold the frames and make contact with through-contacts in the frame walls. Circuit elements are mounted in the frames. The socket tube may be integral or partitioned in one or some of the levels or lengthwise.

19 Claims, 5 Drawing Figures

SOCKET ASSEMBLY

BACKGROUND OF THE INVENTION

The present invention relates to socket structure for receiving and mounting electric circuit elements.

Electric circuit elements particularly electronic circuit elements are to an increasing extent mounted on printed circuit boards which is, of course, a well established technique. These boards vary in sizes and configurations. These boards are, for example, assembled and mounted in a chasis and several chasis are sometimes assembled in a frame to be placed into a common cabinet. Regardless of the number of boards involved, the basic assembly structure remains the same, namely placing the boards in parallel and interconnecting them through back-wiring. This assembly technique may be quite wasteful as to space; if the board spacing is determined on the basis of the largest component to fit on a board and within the multiboard assembly.

DESCRIPTION OF THE INVENTION

It is an object of the present inventaiton to provide for a new and improved compact mounting structure in the form of a socket for mounting a variety of electric circuit elements having quite different dimensions.

In accordance with the preferred embodiment of the present invention, it is suggested to provide a quadrilateral tube having rectangular, preferably square shaped cross section. A plurality of contact springs extend inwardly from the interior wall of the tube, and they are arranged in several levels in the tube if considered in an upright position. These contact springs are connected to or actually continued outwardly for external accessibility, preferably becoming contact pins vanes, flat prongs, or terminals which either extend at right angles from the flat outside walls of the tube or are run along the tube towards one end thereof. A plurality of quadrilateral frames preferably of similar height and having external dimensions matching the rectangular or square shaped cross section of the tube are provided to fit into the tube and to be stacked therein in accordance with the several contact spring levels. The frames have contacts which extend through the wall of the frame for contact making and clamping engagement with the contact springs as extending from the tube whenever the frames are inserted in the tube to register with the particular levels of spring contacts of the tube. The contacts in the frames, on the other hand, extend into the interior of the frame and circuit elements are mounted or connected to or otherwise disposed in the interior of the frame. For example, electrical connections between these contacts as extending into the interior of the frame and the contacts of the circuit elements are completed. The frame contacts may be angle pieces which have been embedded in frame-plastic or have been included in appropriate slots. The frame contacts may themselves be part of a or the circuit elements mounted in the frame in that their contacts are passed through thin slots in the frame and are preferably bent off to become the contacts which will engage the contact springs of the tube once the frame has been inserted. The choice here will depend on the strength or configuration of the contacts which are part of the circuit elements. As far as miniaturizaiton is concerned, printed circuit boards of small dimensions may be inserted and mounted in the frame.

As stated, contact prongs or the like extend either away from the four outer side walls of the socket tube and/or beyond one axial end thereof. In either configuration printed circuit boards can be affixed to provide for interconnection between the contacts in the several levels to thereby interconnect the circuit element in the several frames along the outside. These boards themselves may also carry electric and electronic circuit elements. In either case, the mounting structure is a rather compact device of which the tube is, so to speak, the core; it contains a stack of frames which contain various circuit elements while PC boards are mounted on some or all four sides and, possibly also one one or both ends. In connection therewith, it should be realized that one of the frames may have the contacts which extend below the boundaries of the frame and provide for the contacts or some of the contacts which extend from the axial end of the tube, but in this case not from the tubes wall but from the lower frame as inserted.

The socket may be of integral construction and conceivably score lines are provided to break off or cut off unwanted sections if a smaller number of frames is to be stacked. Thus, one may make a long square shaped tube with score lines in each level, and from that long tube suitable lengths are broken or cut off. Alternatively, the socket may actually be sectionalized either laterally along the dividing planes of the several stacking levels for frames or lengthwise to obtain simply constructed single socket wall pieces. Still, alternatively both planes of division can be realized. In either case, socket sections and/or wall elements, etc., are clamped together to assemble the complete sockect.

The partioning along the line of the levels has the advantage that a few sections with capacities for one, two, or five frames will accomodate a large variety in the number of frames to be stacked and mounted. The lengthwise partioning facilitates the soldering of the laterally extending connector prints to printed circuit boards as each such socket wall section is soldered separately to a single flat board. Both modes of partioning combine the advantages of small inventory with simple PC board mounting techniques.

The springs engaging the inserted frames may hold them also physically, however strapping the assembly around the open ends of the socket tube may be safer and inserted lift bands as well as recesses for manual access can be used for taking the frames out of the socket tube.

DESCRIPTION OF THE DRAWING

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Figure 4:
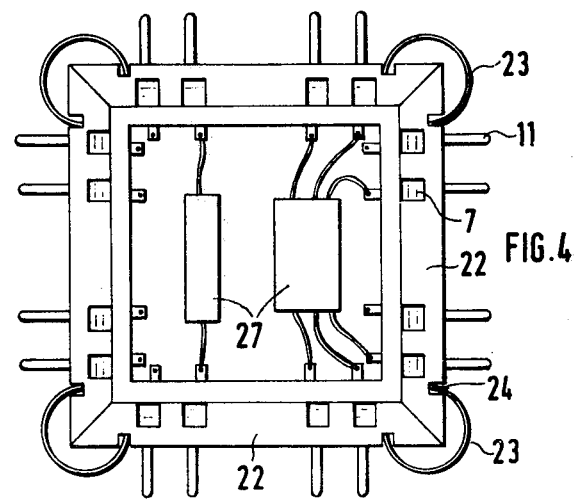
FIG. 4 is a top elevation of a frame constructed from individual wall parts.
Figure 5:
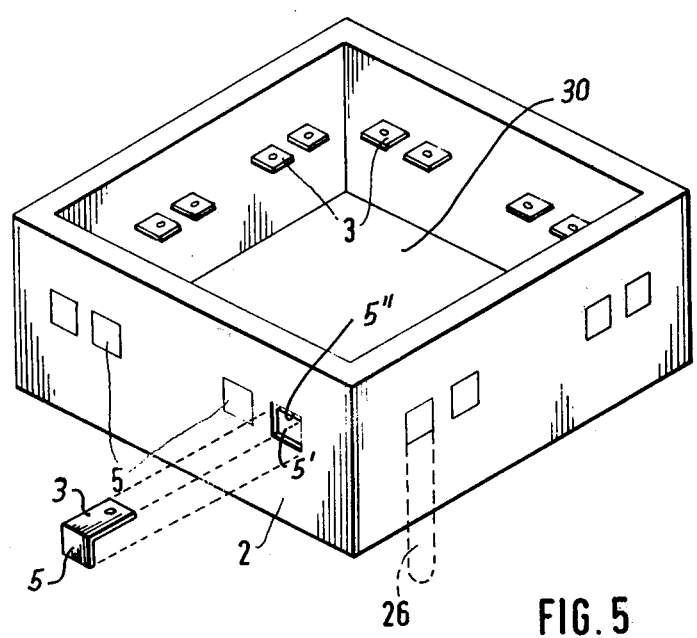
FIG. 5 illustrates by way of example a single frame to be used in any of the socket structures shown in the preceding figures.

Proceeding now to the detailed description of the drawing, I refer first to FIG. 5 illustrating as a basic assembly unit, a particular frame 2 to be used in the plurality and in a stacked configuration in any of the sockets shown in FIGS. 1 through 4. The particular frame illustrated in FIG. 5 has four side walls integrally joined at right angles in the four corners. These side walls are provided with contact surfaces 5 held, for example, in shallow recesses, such as 5' in the side walls so that the contact pieces are flush with the outside of the wall.

Each of these contact pieces 5 is actually an angle or L-shaped element or flat, bent metallic strip so that one flat portion of such an L-shaped piece is externally accessible as contact surface 5. The respective other portion 3 of such an angle piece projects through the respective wall a small slot such as 5'' and extends as lug 3 into the interior of the frame 2. Depending upon the mode of manufacturing, the angle pieces 3–5 may have been cast or molded into position upon extruding of the like of the frame 2. Alternatively (and as shown by way of example) the frame may have been provided with flat slots 5'' into which the angle pieces are inserted and clamped. Such a clamping effect, for example, may be obtained through a slightly bulging contour of the lugs 3.

Providing slots 5'' in the frame wall for purposes of inserting flat contacts has the added advantage that these particular contact pieces 3–5 do not have to be separately provided but may be integral parts and extensions of, for example, circuit boards or other circuit elements to be housed in a frame. Such elements are mounted in the frame 2 through inserting of their contacts and just as the pieces 3–5 are inserted in FIG. 5. Following such an insertion, the contact pieces are simply bent off and into recesses 5' to form the bent down (or up) contact surfaces 5. The bottom of the frame is (or may be) covered with a metal (iron) sheet or foil 30 to serve as an electrostatic and/or magnetic shield, shielding the circuit element or elements in the frame against others staked on top or below in other frames. Conceivably a frame may be empty but for the shield.

It can be seen that this particular frame 2 is provided as a mounting element for a variety of electrical circuit elements. Various types of circuit elements will be shown by way of example and pursuant to the description of the various figures thereby demonstrating the versatility of the construction.

FIG. 5 illustrates a variation in the frame construction. The contact pieces may be provided with long legs such as 26 to extend beyond the bottom of the frame and to establish in this fashion plug-in type contact prongs. The walls of the frame may be provided with shallow frames to receive the contact legs 20. However, it should be noted that in a simplified construction such process or processes such as 5'' do not have to be provided for.

Figure 1:
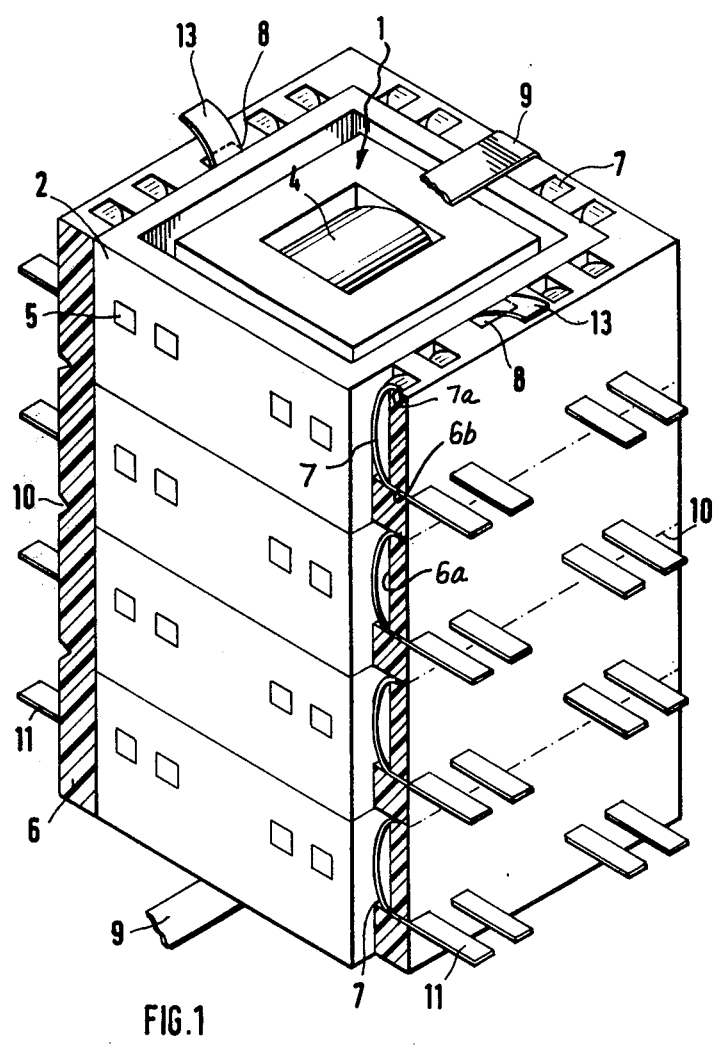
FIG. 1 is an isometric view, partially cut open, of a socket structure in accordance with the preferred embodiment of the invention and showing particularly a socket with four frames.

Turning now to FIG. 1, the particular figure shows a socket 6 of quadrilateral construction with rectangular cross section; preferably one will use the actually shown square shaped configuration. The internal cross section matches the cross section of the frame 2. As can be seen in FIG. 1, four such frames have been stacked into the interior of the socket 1. The socket is provided on an inside with rows of recesses or grooves 6a established several (here four) levels which receive curved contact springs 7. One end 7a of each spring 7 is crimped and inserted into a retaining slot; the spring 7 has an inwardly flexed (as far as the interior of socket 6 is concerned) portion which, in fact, extends out of the particular recess 6a to project into the interior of the tube. The contact spring is curved back and traverses a slot 6b in each instance and becomes an outwardly extending contact vane pin or prong 11.

These contact elements 7, particularly their bulging portion, have dispositions to be clamped against the contact pieces 5 of an inserted frame 2 to make contact therewith. As shown in FIG. 1, the frame 2 receives a relay having a coil 4. The relay has smaller dimensions than the interior of the frame 2 and the contacts or connection pins of the relay 1 are connected to the contact surfaces 5 in that they are, in fact, connected to the lugs 3 of the frame. This way the relay may also be mounted in the frame 2.

The contact springs 7 moreover extend beyond the grooves 6a to such an extent that an inserted frame 2 is positively clamped by the plurality of such contact springs surrounding each frame. Thus, the stack of frames in the socket is held therein in that each frame returns its position in the desired level by clamping. In addition, the assembly is strapped by a strap 9 preferably running on the outside of two walls of socket 6.

Two of the four walls of socket 6 have, along the center, grooves 8 which extend for the length of the socket in the inner wall surfaces therewith. A ribbon 13 is received by these two grooves; the ribbon loops across the bottom opening of socket 6. In fact, the ribbon 13 is looped around the stack of frames. The entire stack of frames can be lifted out of the socket 6 simply by pulling the two ends of ribbon 13 out of the socket.

Reference numeral 10 refers to notches in the frame wall establishing score lines or lines of weakness, without materially deteriorating the strength of the socket but permitting easy separation of parts. It can thus be seen that the socket as such may be made in any length and these notches are provided in a spaced apart distance equal to the level spacing, i.e., the height of a frame. From such tube a desired length of a socket will be cut to accommodate a particular number of frames.

The outside surfaces of the four walls of the socket 6 can actually serve as support surface for integrated circuit plates having apertures for contact making and for receiving the contact process vanes or pins 11. These contact pins extend in a rather organized fashion from the outer surface of tube 6 corresponding to the stacking levels and, due to uniformity in the frame construction, also in columns. This facilitates greatly the design of interconnect PC boards. It can thus be seen that the socket does not only serve as a recipient for particular circuit elements mounted in the stacked frames 2 but interconnect patterns with supplemental circuit elements may be provided on and along the outside the socket which then establishes a rather compact, but possibly complete circuit assembly.

If the lowest frame in the stack has contact pieces such as 26 in FIG. 5, then the entire socket assumes the construction of a plug-in type element so that it may be plugged into another PC board or another socket, etc. That lowest frame may or may not contain circuit elements.

Figure 2:
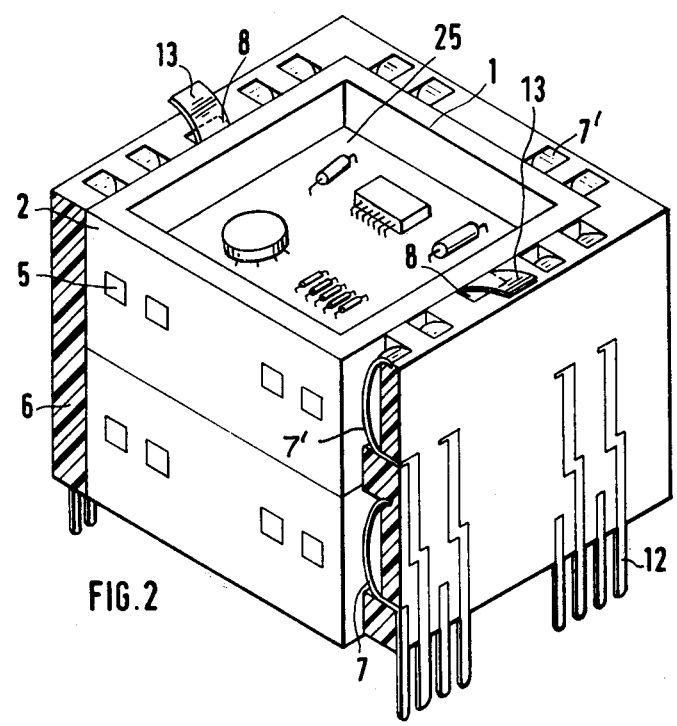
FIG. 2 is a view similar to FIG. 1, but showing a smaller socket for receiving only two frames.

FIG. 2 illustrates a variance of the preferred embodiment differing from the socket 6 of FIG. 1 primarily by the orientation of the externally assembled contacts. The several contact springs 7' are externally continued in flat contacts 12 which run parallel to each other in or on the outer surface of the socket rather than at right angles thereto. These contacts extend or terminate in 5 connector pins which all extend down from the bottom plane of this particular socket. It is, of course, apparent that the stack and socket height is limited to just two, possibly three frames. However, the number of frames that can be accommodated in that instance depends on the width dimensions of the frame and socket and on the number of connecting lines that lead into and out of the frames. That, in turn, may to some extent depend on the number of circuit elements to be mounted. Otherwise, the construction is similar to the construction of FIG. 1, inluding the lift ribbon 13. Of course, printed circuit boards will not be mounted on the sides of the socket, but any interconnet pattern as well as signals and supply voltages are fed to the assembly through the bottom plane and, e.g., a PC board into which the prongs or pins 12 are plugged.

In addition, the FIG. 2 illustrates a particular upper frame 2 which includes a printed circuit board 25. This particular printed circuit board is shown here as just another example and it carries a number of circuit elements being interconnected on and by the plate by the usual art work. The particular plate 25 may have been inserted and connected to the contact lugs 3 in a manner readily derivable from the drawing. However, it is conceivable that actually the plate 25 as such is integral with the frame. In either case, there will be external contact surfaces such as 5 for external contact making and electrical connection to the printed circuit pattern which is either on the top or on the bottom of plate 25 or both.

Figure 3:
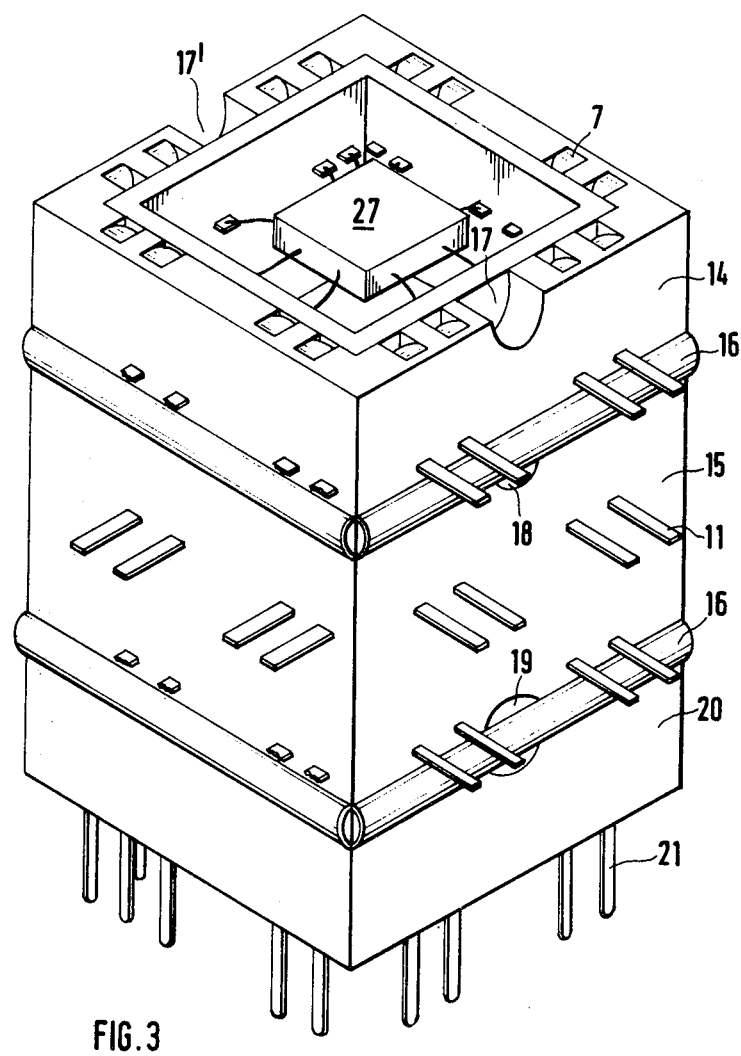
FIG. 3 is of a multi-section socket structure in an isometric view.

The particular example shown in FIG. 3 includes a socket which is the composite of plural socket elements or sections such as 14, 15, and 20. These sections are combined in building block fashion. The socket 14 is provided for receiving a single frame. The same is true with regard to the socket 20. The socket 15 is provided to receive two frames. As part of a set of socket sections one may have available another particular type of socket which is capable of receiving five frames. These particular type of socket sections can be assembled into larger socket units; thus, the FIG. 3 shows a three-socket stack for accommodating four frames.

The two socket sections 14 and 15 are interconnected by means of resilient half tubes or semi cylindrically curved clamps 16. The same is true for the connection between socket section 15 and socket section 20. These sheets 16 will be slightly spread and inserted in suitable grooves in the socket sections; these grooves are provided along top and bottom of each socket section and the clamps 16 when inserted hold juxtaposed socket sections together.

In addition, the socket sections such as 14 have two recesses 17, 17' which face each other across the socket interior. These recesses are provided for the insertion of singles so that the frame 2 therein can be gripped and lifted from the stack. The two-frame socket 15 has recesses 18 and 19 respectively on top and bottom to remove the two frames therein through the opposite openings of the socket frame. The five level socket section (not shown) should be provided with the lifting ribbon such as 13 and FIG. 1 and should have grooves along the inside accordingly.

Otherwise, these socket sections are constructed just as socket 6 in FIG. 1, and that includes particularly internal grooves for holding contact springs 7, and the various contact pins 11 extend from the respective outer surfaces for purposes of connection to interconnect PC boards as described. The particular bottom socket section 20 may be provided also for receiving a frame 2 or is just provided as a socket element having contact pins 21 which extend from the bottom of that particular socket section. The laterally affixed PC boards may have downwardly extending pins which will be plugged into the same PC board which receives the pins 21. In lieu of this particularly kind of socket section 20 one could use a bottom frame section of the same type shown and described under reference numeral 14, under insertion of a frame of the type which has downwardly extending prongs 26. Still alternatively one of the socket sections may have a configuration of the type as shown in FIG. 2 having downwardly extending contacts 12. In all these cases bottom PC boards as well as sidewall PC boards can be used.

The socket of FIG. 4 is actually a variation of any of the sockets described earlier, except that laterally extending contact pins 11 have been shown for the representation; the contact pins could actually be provided as shown in FIG. 2. This specific example illustrates the lengthwise partitioning of a socket. Accordingly, the socket is constructed from four plane plates 22 each having beveled edges. These plates have longitudinal grooves 24 adjacent to the edges and clamps of ¾ tube like contour are slipped into the grooves of respectively two joining plates, having been placed into abutment particularly with the beveled edges. Four of such clamps 23 hold four plates together to assemble a particular socket.

FIGS. 3 and 4 shows also a different kind of circuit element 27 and mounting thereof; but again by way of example only and applicable to other kinds of sockets. For example, a large scale integrated circuit or a potted circuit element 27 has been inserted in one of the frames 2 being here the top frame of the assembly. The particular frame has contact lugs 3 as described and wires extending from the particular element or elements 27 are connected, i.e., soldered or otherwise connected to the lugs 3. If the wires are sufficiently strong they will also physically mount the element or elements 27, in the particular frame 2.

If one uses the laterally extending contact pins as illustrated, it was found to be very practical to plug each socket plate first into the respective printed circuit board and to solder the pins to the respective PC board. The socket plates with PC boards attached are then assembled to a socket, and the frames are then stacked in the socket tube as described.

It can readily be seen that the principle of partitioning the frame stock in accordance with individual and plural levels (FIG. 3) and the lengthwise partitioning, to obtain plane frame walls (FIG. 4) can be combined which is advantageous for manufacturing assembly and inventory.

The invention is not limited to the embodiments described above, but all changes and modifications thereof not constituting departures from the spirit and scope of the invention are intended to be included.

I claim:

1. Socket structure for mounting a plurality of electric and/or electronic circuit elements, comprising:

a quadrilateral socket tube with rectangular or square-shaped cross section being of elongated configuration and being open at its ends;

a plurality of contact springs extending inwardly from the tube and being continued outwardly therefrom for external accessibility, the plurality of contact springs being arranged in several levels in the tube;

a plurality of similar quadrilateral mounting frames not constituting circuit elements or portions thereof themselves and having external dimensions matching the rectangular or square-shaped cross section of the tube to fit into said tube, each frame further having four joined side walls with apertures, all said frames being stacked in the tube by insertion from one of said ends and each having a height commensurate with said levels of said contact springs in the tube;

contacts mounted in the frames and extending outwardly through the apertures in the side walls of the respective frame, said contacts clamping and making engagement with the said contact springs of the tube, said contacts extending also into the interior of the frames; and circuit elements disposed and mounted in the frames and being electrically connected to the contacts as extending into the frames.

2. Socket structure as in claim 1, said frame contacts pertaining to the circuit elements and being passed through slots in the frame walls.

3. Socket structure as in claim 1, said frame contacts being angle pieces, each having one leg on the outside of one of the walls while the respective other legs each extend into the interior of the frame.

4. Socket structure as in claim 3, said one extending leg extending as contact prong into the interior of the frame and beyond the inner boundary of the frame.

5. Socket structure as in claim 3, said frame contacts being embedded in the frames.

6. Socket structure as in claim 3, said frame contacts being inserted in slots in the frame.

7. A socket structure as in claim 1, the socket tube being partioned into several sections each for holding at least one frame and including means for locking the sections together.

8. Socket structure as in claim 7, the contact springs of one of the sections extending outwardly away from the end opening of the socket tube, the contact springs from the other sections having outward extensions extending laterally away from the socket tube.

9. A socket structure as in claim 7, wherein the sections are provided with recesses for gripping an inserted frame.

10. A socket structure as in claim 1, said outward extensions of the springs being contacts, at least some of them extending laterally away from the tubes.

11. A socket structure as in claim 1, at least some of said outward extensions of the contact springs extending along the outer surface of the tube towards and beyond one end of the tube.

12. A socket structure as in claim 1, and including a strap extending across the open ends of the tube for holding the frames therein.

13. A socket structure as in claim 1, including longitudinal grooves in two opposite interior walls of the tube, facing each other across the interior of the tube, and receiving a lift ribbon which extends in the grooves as well as across an open end of the tube.

14. A socket structure as in claim 1, said tube being longitudinally divided into wall sections and there being means for clamping wall sections together.

15. Socket structure as in claim 1, wherein said socket tube is an integral element.

16. A socket structure as in claim 15, wherein said tube being provided with score lines separating several levels for permitting separation of individual socket sections of the tube.

17. A socket structure as in claim 1, including shielding means between the frames in the tube.

18. A socket structure as in claim 1, including individual circuit elements directly and individually mounted to the frames by connection to the contacts as extending into the frame.

19. A socket structure as in claim 1, including printed circuit boards in the frames.

* * * * *